United States Patent
Rhodes et al.

(10) Patent No.: US 6,838,714 B2
(45) Date of Patent: Jan. 4, 2005

(54) LOW LEAKAGE DIODES, INCLUDING PHOTODIODES

(75) Inventors: Howard E. Rhodes, Boise, ID (US); Werner Juengling, Boise, ID (US); Thomas A. Figura, Nishiwaki (JP); Steven D. Cummings, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 265 days.

(21) Appl. No.: 09/780,390

(22) Filed: Feb. 12, 2001

(65) Prior Publication Data

US 2001/0017382 A1 Aug. 30, 2001

Related U.S. Application Data

(62) Division of application No. 09/358,543, filed on Jul. 22, 1999, now Pat. No. 6,534,335.

(51) Int. Cl.[7] .................. H01L 27/148; H01L 31/062
(52) U.S. Cl. ........................ 257/233; 257/292
(58) Field of Search ................ 257/233, 292, 257/367, 509

(56) References Cited

U.S. PATENT DOCUMENTS

| 4,280,271 A | 7/1981 | Lou et al. |
| 4,663,645 A | 5/1987 | Komori et al. |
| 5,032,535 A | 7/1991 | Kamijo et al. |
| 5,352,620 A | 10/1994 | Komori et al. |
| 5,495,116 A | 2/1996 | Funakoshi et al. |
| 5,496,750 A | 3/1996 | Moslehi |
| 5,861,655 A | 1/1999 | Kozuka et al. |
| 5,942,775 A | 8/1999 | Yiannoulos |
| 5,956,588 A | 9/1999 | Choi et al. |
| 6,140,670 A | * 10/2000 | Chang ................ 257/233 |
| 6,143,612 A | 11/2000 | Derhacobian et al. |
| 6,150,676 A | 11/2000 | Sasaki |
| 6,201,270 B1 | 3/2001 | Chen |
| 6,218,691 B1 | 4/2001 | Chung et al. |
| 6,259,145 B1 | * 7/2001 | Connolly et al. ........ 257/431 |

FOREIGN PATENT DOCUMENTS

| JP | 4-315442 | 4/1992 |
| JP | 5-102403 | 4/1993 |

* cited by examiner

Primary Examiner—Matthew Smith
Assistant Examiner—Lex H. Malsawma
(74) Attorney, Agent, or Firm—Dickstein Shapiro Morin & Oshinsky LLP

(57) ABSTRACT

A photodiode for use in an imager having an improved charge leakage. The photodiode has a doped region that is spaced away from the field isolation to minimize charge leakage. A second embodiment of invention provides a second implant to improve charge leakage to the substrate. The photodiodes according to the invention provide improve charge leakage, improved reactions to dark current and an improved signal to noise ratio. Also disclosed are processes for forming the photodiode.

108 Claims, 5 Drawing Sheets

LOW LEAKAGE DIODES, INCLUDING PHOTODIODES

This application is a divisional application of U.S. patent application Ser. No. 09/358,543 filed Jul. 22, 1999, now U.S. Pat. No. 6,534,335 the entirety of which is incorporated herein by reference.

FIELD OF THE INVENTION

The invention relates generally to an improved diode for use in semiconductor devices The invention also relates generally to an improved photodiode having lower charge leakage to the substrate for use in imaging devices.

BACKGROUND OF THE INVENTION

Diodes find use in many solid-state devices. Diodes which respond to light, known as photodiodes, are widely used in many solid-state image sensors, also known as imagers, which were developed in the late 1960s and early 1970s primarily for video image acquisition, transmission, and display. An imager employing a photosensitive diode absorbs incident radiation of a particular wavelength (such as optical photons, x-rays, or the like) and generates an electrical signal corresponding to the absorbed radiation. Typical devices which use photosensitive diodes include charge coupled devices (CCDs), photodiode arrays, charge injection devices, hybrid focal plan arrays, memory and logic circuits and CMOS imagers.

In the case of photosensitive devices such as CCD's or CMOS imagers, the photosensitive region is typically a p-n junction. This junction is reverse biased by applying an electrical potential Vo which reverse biases the p-n junction. The p-n junction is then isolated typically by turning off a "reset transistor" that is used to reverse bias the junction. Under illumination, incident light photons create electron-hole pairs that are separated by the electric field in a depletion region of the p-n junction. This separation by the electric field results in one charge type being stored in the depletion region, thus collapsing the depletion region, and reducing the voltage Vo across the p-n junction. It is this reduction in voltage across the diode p-n junction due to light exposure that is measured.

To provide context for the invention, an exemplary prior art photodiode is described below with reference to FIG. 1. However, it is to be understood that the invention also has utility in any semiconductor diode device which includes a p-n junction where there is leakage to the substrate. Accordingly, the present invention may also find utility in semiconductor devices where p-n junctions are shielded from light, where p-n junctions are formed in a p-well, where p-n junctions are formed in an n-well, or more complicated junctions such, for example, a p-n-p junction. Also, while FIG. 1 shows a simplified photodiode 15 for use as a pixel of an imager, it should be understood that the single photodiode pixel 15 in practical use will be a part of either a row of pixels or an M×N array of pixels arranged in rows and columns.

The photodiode 15 of FIG. 1 is shown in part as a cross-sectional view of a semiconductor substrate 10 doped with a p-type material to form p-well 12. A field oxide region 20, which serves to surround and isolate the photodiode 15 may be formed by thermal oxidation of the doped substrate 10, or by chemical vapor deposition of an oxide material as in the STI (shallow trench isolation) process. More highly doped p-type regions 40 are formed under the field oxide region 20 and an n-type implant 30 is formed between the field oxide regions 20. The field oxide regions 20 may be formed before or after doped regions 30, 40. As shown in FIG. 1, p-type regions 40 and n-type implant 30 are typically doped so as to form a junction of regions 30 and 40 that is aligned or self-aligned to the edge of the field oxide 20. However, the overlapping of the p-type region 40 and the n-type region 30 results in current leakage from the photodiode to the substrate 10 through the depletion region.

The resolution of the imaging device is a function of the size and performance of each photodetector. To improve resolution, such as by presenting more image lines per inch of visual display, a greater number of photoconductors are required per unit area of the photodetector array. Imager performance is degraded if individual photodiodes have high charge leakage. It is important that the photodetector array be fabricated to allow the photodiode charge to be accurately read within the allowed data sampling time of the system.

There is needed, therefore, an improved photodiode for use in an imager apparatus that exhibits decreased charge leakage to the substrate through the depletion region. There is also need for an improved p-n junction diode for other integrated circuit applications, such as DRAM applications, which likewise exhibits reduced charge leakage to the substrate through a depletion region. A method of fabricating diodes, including photodiodes exhibiting these improvements is also needed.

SUMMARY OF THE INVENTION

The present invention provides a photodiode having improved leakage characteristics to the substrate and improved dark current characteristics. A photodiode comprises a first conductive region of the photodiode that is spaced away from the edge of a field oxide. The present invention also provides methods for forming the photodiode of the present invention.

The present invention also relates to a p-n junction diode used in other integrated circuit applications where charge leakage to the substrate through the depletion region may occur, such as where a p-n junction is formed adjacent to field oxide isolation at the memory storage node of a DRAM. In this case too the invention also provides a p-n junction with reduced leakage to substrate and method for fabricating the same by spacing the p-n junction from high leakage areas.

Additional advantages and features of tie present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photodiode and apparatus for converting electromagnetic radiation to an electrical signal. The following detailed description is, therefore, not to be taken in a limiting sense, and the scope of the present invention is defined by the appended claims.

Figure 2:
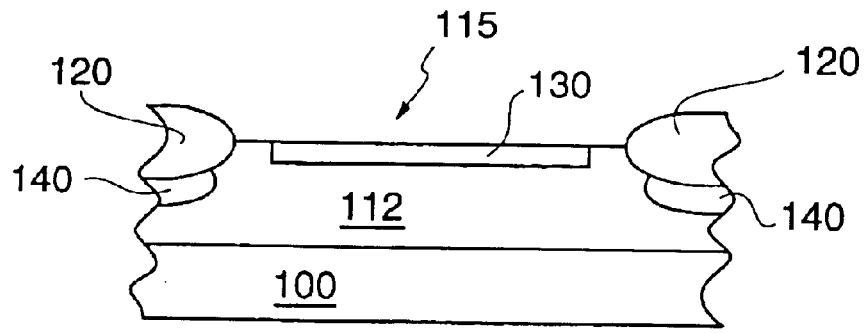
FIG. 2 is a cross-sectional view of a semiconductor wafer undergoing the process of a first embodiment of the invention.

The structure of the photodiode 115 of the first embodiment is shown in more detail in FIG. 2. The photodiode 115 may be formed in a substrate 100 doped to a first conductivity type, which for exemplary purposes is treated as a p-well 112 formed in substrate 100. A field oxide region 120 is formed around the photodiode 115 as is shown in FIG. 2. The field oxide region 120 may be formed by thermal oxidation of the doped substrate 100, or by chemical vapor deposition of an oxide material according to the STI process. While the invention is described with reference to field oxide regions 120 formed by the Local Oxidation of Silicon (LOCOS) process, it should be understood that the field oxide regions may be formed using the shallow trench isolation (STI) process.

Still with reference to FIG. 2, a first mask and resist (not shown) is applied to the substrate 100 to form p-type doped regions 140 and n-type region 130 in p-well 112. The mask and resist are applied to the photodiode 115 to form the n-type region 130 such that n-type region 130 is spaced away from field oxide regions 120 to reduce the electric field at the edges of the defined p-n junction. It should be understood that any suitable doping process may be used, such as ion implantation, or chemical vapor deposition. The n-type region 130 is preferably doped with arsenic, antimony or phosphorous at a dopant concentration level of from about $1\times10^{11}$ ions/cm$^2$ to about $1\times10^{16}$ ions/cm$^2$. Preferably the dopant is phosphorous which provides a less abrupt junction between the doped region and the substrate, less leakage and little damage to the underlying substrate.

The p-type regions 140 are shown in the figure as being formed under the field oxide regions 120. It should be understood that the p-type regions 140 would be formed underneath a STI or LOCOS if these forms of isolation are to be used. It should also be understood that the p-type regions 140 may be formed spaced away from the edge of the field oxide region 120, as shown, or p-type regions 140 may be formed such that the edge of the p-type region 140 is in contact with the edge of the field oxide region 120. Any suitable doping process known in the art may be used to form the p-type regions under the field oxide regions 120, such as, for example ion implantation. The p-type region 140 is preferably doped with boron at a dopant concentration level of from about $1\times10^{11}$ ions/cm$^2$ to about $1\times10^{14}$ ions/cm$^2$.

Figure 3:
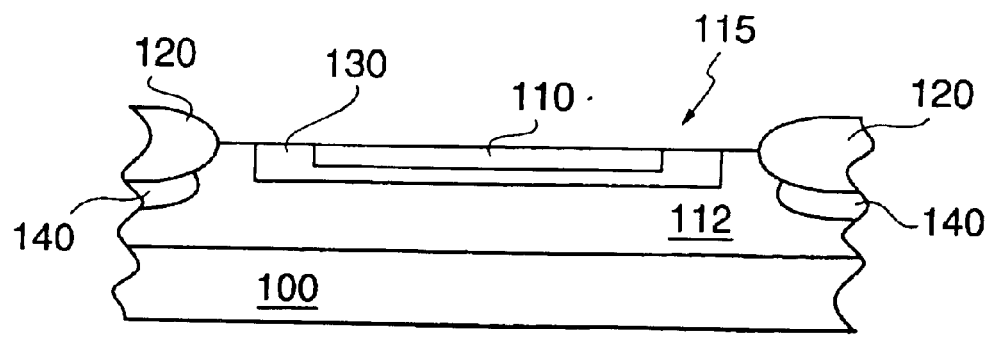
FIG. 3 illustrates the wafer at a processing step subsequent to that shown in FIG. 2.

Reference is made to FIG. 3. A second n-type region 110 is formed within the boundaries of first n-type region 130. A second resist and mask (not shown) are applied to the photodiode and the substrate is doped to form second n-type region 110. As set forth above, any suitable doping process may be used, such as ion implantation. The second n-type region 110 is doped with arsenic, antimony or phosphorous at a dopant concentration level of from about $1\times10^{12}$ ions/cm$^2$ to about $1\times10^{16}$ ions/cm$^2$. Preferably the dopant is phosphorous for the reasons set forth above. The resist and mask are removed, leaving a structure that appears as shown in FIG. 3.

It is desired that the second n-type region 110 is doped to a higher dopant concentration than the first n-type region 130 such that the charge collected in the photodiode 115 is isolated in the second n-type region 110. By isolating charge collected by the photodiode 115 in the second n-type region 110, charge leakage to the substrate is reduced. For example, if the first n-type region 130 is doped at a dopant concentration of $1\times10^{12}$ ions/cm$^2$ the second n-type region 110 would be doped at a doping concentration of about $1\times10^{13}$ ions/cm$^2$ or greater. However, it should be understood that in the present invention the specific level of doping concentration is not critical, provided that the second n-type region 110 is doped at a higher concentration than the first n-type region 130. For example, it should be Understood that a first n-type region 130 that is doped n− and a second n-type region 110 doped n+, where n+ is simply defined to be a concentration greater than n− is within the scope of the present invention.

For the photodiode 115 of the first embodiment, the processing is essentially complete at this stage, and conventional processing methods may then be used to form contacts and wiring to connect the photodiode 115 to an imager apparatus. For example, the entire surface of the photodiode may then be covered with a passivation layer of, e.g., silicon dioxide or BPSG, which is CMP planarized and etched to provide contact holes, which are then metallized to provide contacts to the photodiode 115.

Figure 4:
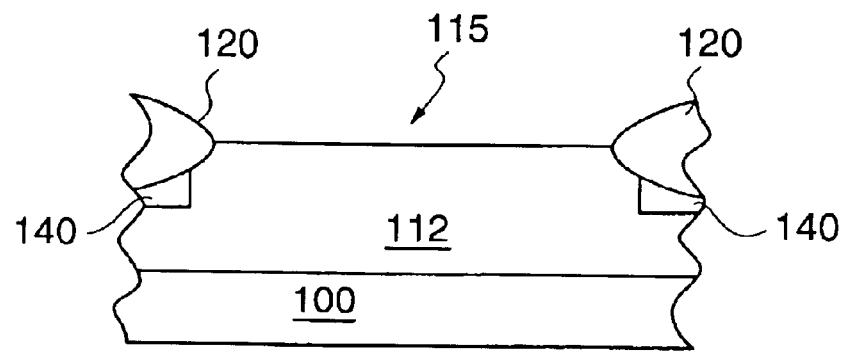
FIG. 4 is a cross-sectional view of a semiconductor wafer according to the first embodiment of the present invention undergoing a second embodiment of the process to form the photodiode of the first embodiment of the present invention.
Figure 5:
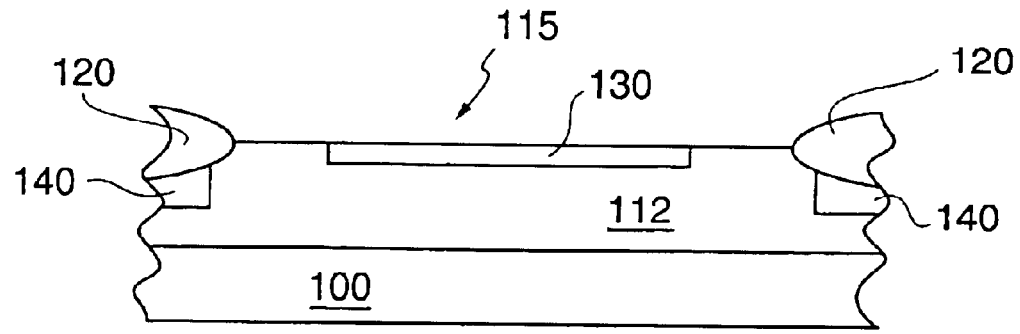
FIG. 5 illustrates the wafer at a processing step subsequent to that shown in FIG. 4.
Figure 6:
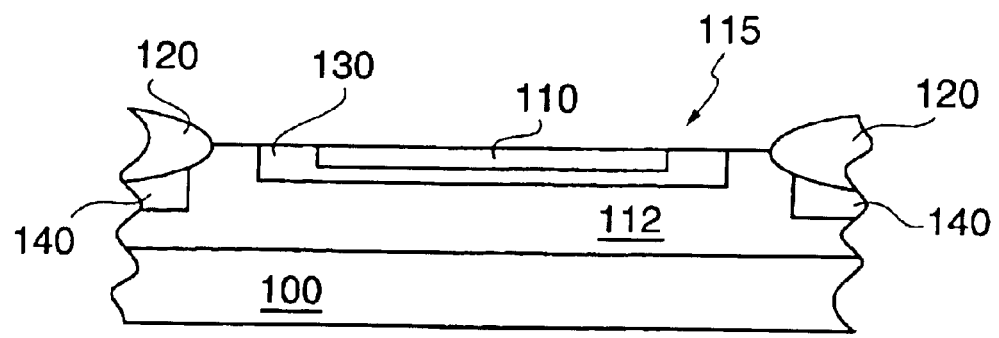
FIG. 6 illustrates the wafer at a processing step subsequent to that shown in FIG. 5.

An alternative second embodiment of the process is illustrated by FIGS. 4 through 6. As shown in FIG. 4, the process also begins with a substrate doped to a first conductivity type, which for exemplary purposes is treated as a p-type substrate. A field oxide region 120 is formed around the photodiode 115 as is shown in FIG. 2. The field oxide region 120 may be formed as described above.

A first mask and resist (not shown) is applied to the substrate 100 and the substrate 100 is doped to form p-type doped regions 140 beneath field oxide regions 120 as illustrated in FIG. 4. As noted above with respect to FIG. 2, any suitable doping process may be used, such as ion implantation. The photodiode region 115 is shown in p-well 112.

Reference is now made to FIG. 5. A second mask and resist (not shown) are applied to the photodiode 115 to form the first n-type region 130 such that n-type region 130 is spaced away from the field oxide regions 120 to facilitate reduction of the electric field across the p-n photodiode junction at the photodiode edge. Any suitable doping process may be used to form n-type region 130, such as ion implantation.

A second n-type region 110 is formed within the boundaries of the first n-type region 130. A third resist and mask (not shown) is applied to the photodiode 115 and the substrate is doped to form second n-type region 110. As set forth above, any suitable doping process may be used, such as ion implantation. Again, as was true of FIG. 3, it is important that the second n-type region 110 is doped to a higher dopant concentration than the first n-type region 130 such that the charge collected in the photodiode 115 is isolated in the second n-type region 110. The resist and mask are removed, leaving a structure as illustrated in FIG. 6.

For the photodiode 115 of the first embodiment, the processing is essentially complete at this stage, and conventional processing methods may then be used to form contacts and wiring to connect the photodiode 115 to an imager apparatus as described in more detail above with reference to FIG. 3.

Figure 7:
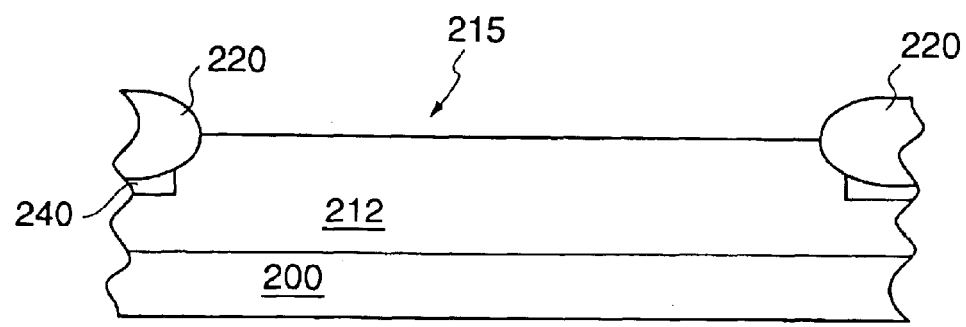
FIG. 7 is a cross-sectional view of a semiconductor wafer undergoing a first process according to a second embodiment of the invention.
Figure 8:
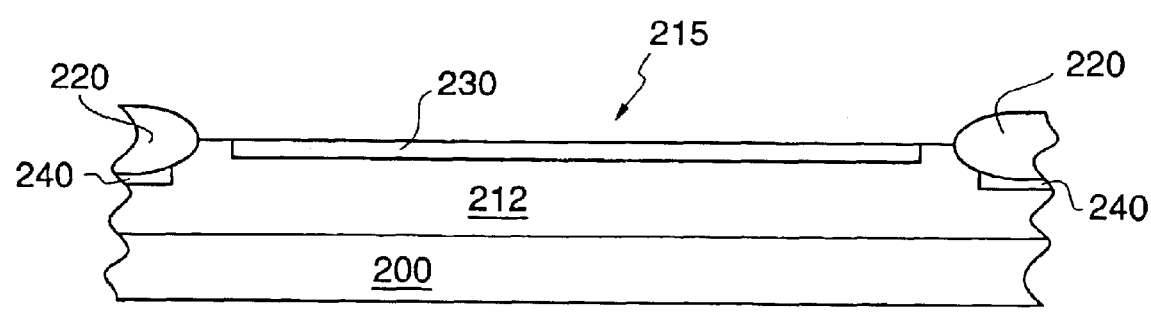
FIG. 8 illustrates the wafer at a processing step subsequent to that shown in FIG. 7.
Figure 9:
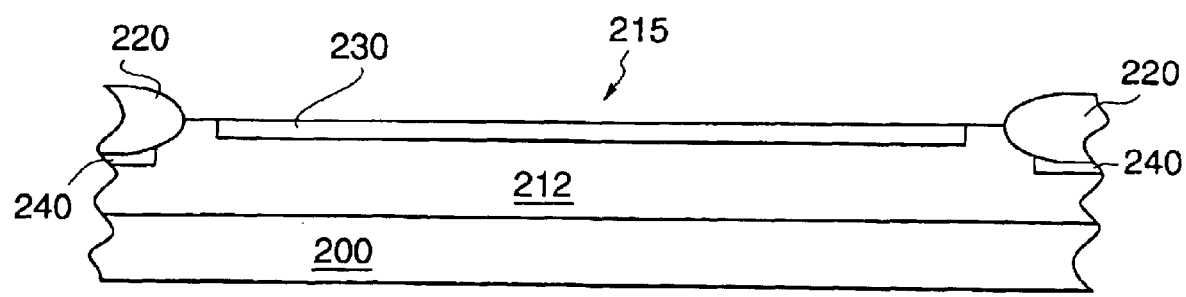
FIG. 9 is a cross-sectional view of a semiconductor wafer undergoing a second process according to a second embodiment of the invention.

A third embodiment of the present invention is illustrated by FIGS. 7–9. Reference is now made to FIG. 7. The photodiode 215 may be formed in a substrate 200 doped to a first conductivity type to form p-well 212. A field oxide region 220 is formed around the photodiode 215 as shown in FIG. 7. The field oxide region 220 may be formed by thermal oxidation of the doped substrate 200, or by chemical vapor deposition of an oxide material. While the invention is described with reference to field oxide regions 220 formed by the LOCOS process, it should be understood that the field oxide regions may be formed using the STI process.

Still with reference to FIG. 7, a first mask and resist (not shown) is applied to the substrate 200 and the substrate is doped to form p-type doped regions 240 under field oxide region 220. It should be understood that the p-type regions 240 would be formed underneath a STI or LOCOS formed isolation. It should also be understood that the p-type regions 240 may be formed spaced away from the edge of the field oxide region 220, as shown, or p-type regions 240 may be formed such that the edge of the p-type region 240 is in contact with the edge of the field oxide region 220. Any suitable doping process may be used, such as, for example, ion implantation. The p-type region 240 is preferably formed by doping the substrate 200 with boron at a dopant concentration level of from about $1\times10^{11}$ ions/cm$^2$ to about $1\times10^{14}$ ions/cm$^2$.

Reference is now made to FIG. 8. A second mask and resist (not shown) are applied to the photodiode 215 to form the n-type region 230 such that n-type region 230 is spaced away from the field oxide regions 220 to facilitate the reduction of the electric field across the p-n junction of the photodiode at the photodiode edge. Any suitable doping process may be used, such as ion implantation. The n-type region 230 may be doped with arsenic, antimony or phosphorous at a dopant concentration level of from about $1\times10^{11}$ ions/cm$^2$ to about $1\times10^{16}$ ions/cm$^2$. Preferably the dopant is phosphorous as phosphorous gives less abrupt junctions, less leakage and causes little damage to the underlying substrate.

For the photodiode 215 of the third embodiment, the processing is essentially complete at this stage, and conventional processing methods may then be used to form contacts and wiring to connect the photodiode 215 to an imager apparatus. For example, the entire surface of the photodiode may then be covered with a passivation layer of, e.g., silicon dioxide or BPSG, which is CMP planarized and etched to provide contact holes, which are then metallized to provide contacts to the photodiode 215.

A second process for preparing the photodiode of the third embodiment of the present invention is described with reference to FIG. 9. As shown in FIG. 9, this process also begins with a substrate 200 doped to a first conductivity type, which for exemplary purposes is treated as a p-well 212. A field oxide region 220 is formed around the photodiode 215. The field oxide region 220 may be formed as described above.

Still with reference to FIG. 9, a mask and resist (not shown) is applied to the substrate 200 and the substrate is doped to form p-type doped regions 240 beneath field oxide regions 220 as well as n-type region 230, provided that n-type region 230 is spaced away from the field oxide regions 220 to facilitate the reduction of the electric field across the p-n photodiode at the photodiode edge. As set forth above with respect to FIGS. 7–8, any suitable doping process may be used to dope regions 230, 240, such as, for example, ion implantation. The resist and mask are then removed, leaving the structure illustrated in FIG. 9.

For the photodiode 215 of the third embodiment, the processing is essentially complete at this stage, and conventional processing methods may then be used to form contacts and wiring to connect the photodiode 215 to an imager apparatus as described in more detail above.

The spacing of the n-type region 130, 230 away from the field oxide region 120, 220 is dependant upon several factors. The spacing of the n-type region 130, 230 is dependant upon the dopant concentration and the bias voltage. Preferably the spacing of the n-type region 130, 230 from the field oxide region 120, 220 should be about the magnitude of one depletion region. It should be understood that the width of the depletion region will vary depending upon the generation of the process design as well as the bias voltage, the dopant concentration, thermal processing and junction depth. For example, in a 0.25 $\mu$m process using a 5V bias voltage across the photodiode, the space between the n-type region 130, 230 and the field oxide region 120, 220 is from about 0.05 $\mu$m to about 1.0 $\mu$m, preferably from about 0.1 $\mu$m to about 0.8 $\mu$m, most preferably about 0.2 to about 0.7 $\mu$m.

Figure 1:
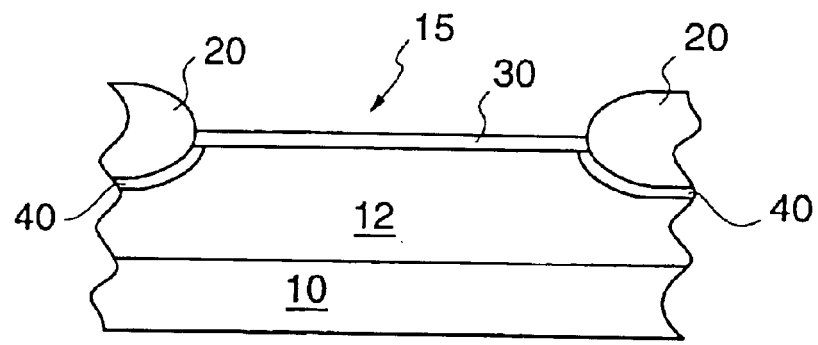
FIG. 1 is a photodiode according to the prior art.
Figure 10:
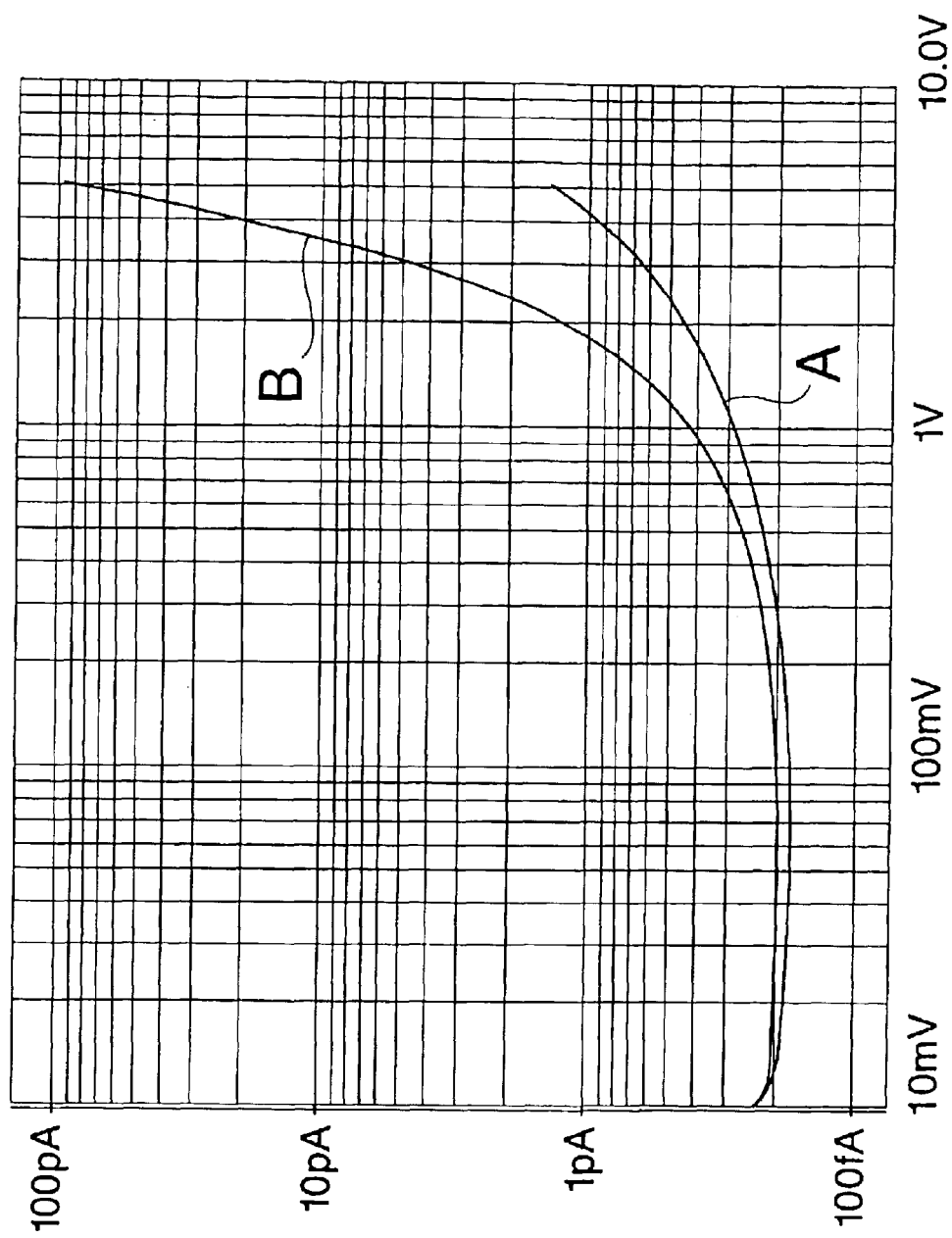
FIG. 10 illustrates a comparison of the current leakage between the photodiodes of the present invention and the photodiodes according to the prior art.

Reference is now made to FIG. 10. The figure shows the reverse biased leakage from the photodiode versus the voltage applied to the photodiode on a log/log scale. Curve A represents a photodiode where the n-type region was set back from the field oxide region approximately 0.6 $\mu$m while curve B represents a photodiode where the n-type region and the field oxide region were self aligned as described in reference to FIG. 1 above. As can be seen from FIG. 10, as the voltage increases above 1V, the reverse biased leakage from the photodiode processed according to the prior art (curve B) increases asymptotically. In contrast, the reverse biased leakage of the photodiode fabricated according to the present invention (curve A) does not increase as rapidly as the prior art photodiode.

Figure 11:
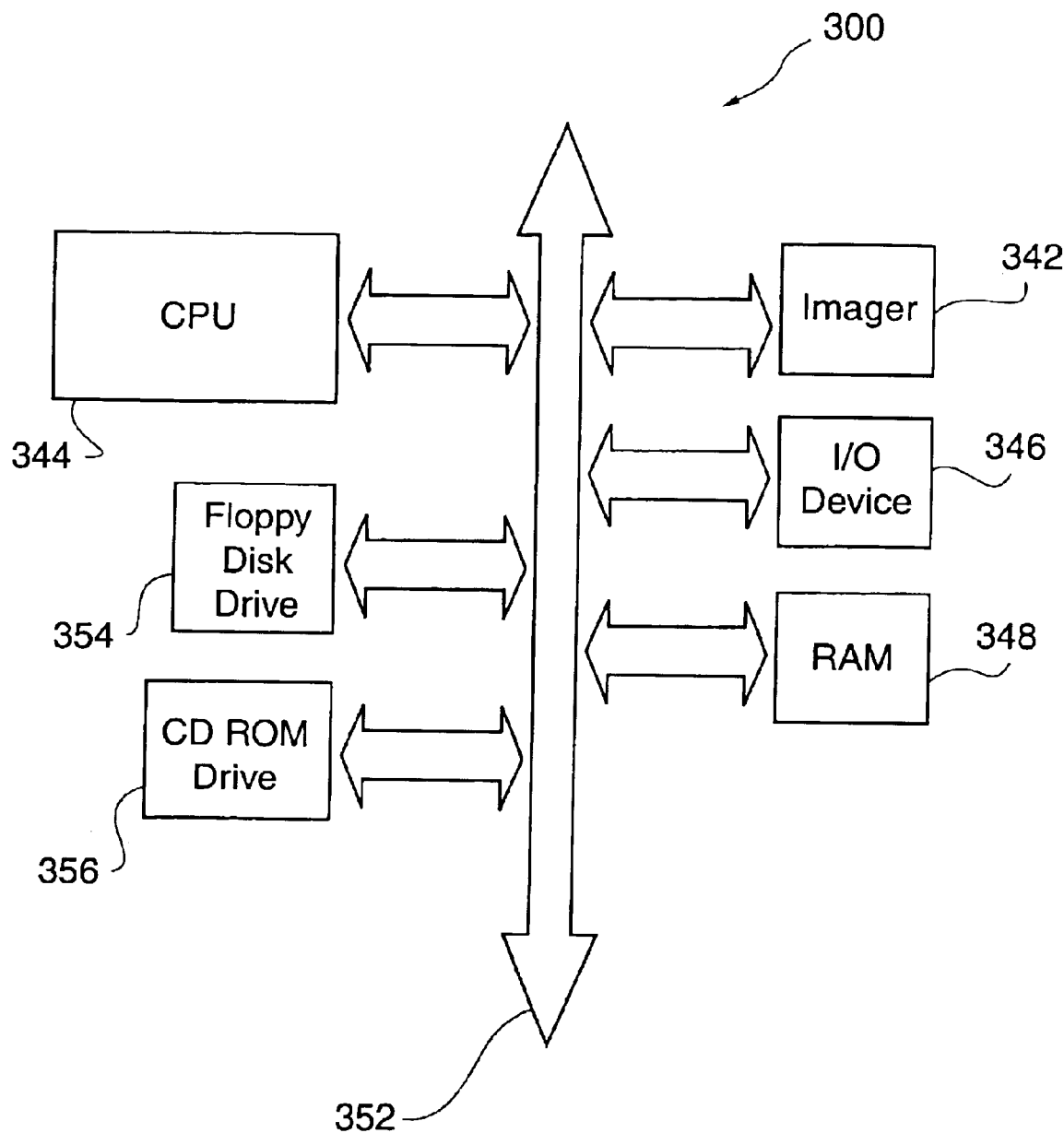
FIG. 11 illustrates a processor based system which includes a photodiode based imager device

A typical processor based system which includes a photodiode based imager device according to the present invention is illustrated generally at 300 in FIG. 11. A processor based system is exemplary of a system having digital circuits which could include CMOS imager devices, CCD imager devices or the like. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 344 that communicates with an input/output (I/O) device 346 over a bus 352. The photodiode containing imager 342 also communicates with the system over bus 352. The computer system 300 also includes random access memory (RAM) 348, and, in the case of a computer system may include peripheral devices such as a floppy disk drive 354 and a compact disk (CD) ROM drive 356 which also communicate with CPU 344 over the bus 352. Photodiode containing imager 342 is preferably constructed as an integrated circuit which includes pixels containing photodiodes optimized for low leakage, as previously described with respect to FIGS. 2 through 9. The imager 342 may be combined with a processor, such as a CPU, digital signal processor or microprocessor, in a single integrated circuit, or may reside on a separate integrated circuit.

It should be understood that various alternatives to the embodiments of the invention described herein may be employed in practicing the invention. For example, although the operation of the present invention has been described with respect to a photodiode formed by n-type implants into a p-well, the present invention applies equally well to a photodiode formed by a p-type implant into an n-well or even more complicated photodiodes such a p-n-p diodes, as well as to diodes in general which have p-n junction leakage to a substrate. Similarly, the processes described above are examples of the many processes that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A diode, said diode comprising:
   an isolation region formed in a substrate;
   a first doped active layer of a first conductivity type formed in said substrate, wherein said first doped layer is spaced apart from said isolation region;
   a second doped active layer of a second conductivity type in contact with said first doped active layer, the contact of said first and second active layers forming a p-n junction;
   a third doped region formed in said second doped active layer beneath said isolation region; and
   a fourth doped active layer at least partially within said first doped active layer.

2. The diode according to claim 1, wherein the first conductivity type is n-type, and the second conductivity type is p-type.

3. The diode according to claim 1, wherein said isolation region is a field oxide region formed by the Local Oxidation of Silicon process.

4. The diode according to claim 1, wherein said isolation region is a field oxide region formed by the Shallow Trench Isolation process.

5. The diode according to claim 1, wherein said first doped active layer is spaced from said isolation region by from about 0.05 $\mu$m to about 1.0 $\mu$m.

6. The diode according to claim 5, wherein said first doped active layer is spaced from said isolation region by about 0.1 $\mu$m to about 0.8 $\mu$m.

7. The diode according to claim 6, wherein said first doped active layer is spaced from said isolation region by about 0.2 $\mu$m to 0.7 $\mu$m.

8. The diode according to claim 1, wherein said third doped region is spaced away from an edge of said isolation region at a surface of said substrate.

9. The diode according to claim 1, wherein said third doped region is a p-type region.

10. The diode according to claim 1, wherein said first doped active layer is doped with dopants selected from the group consisting of arsenic, antimony and phosphorous.

11. The diode according to claim 10, wherein said first doped active layer is doped with phosphorous.

12. The diode according to claim 10, wherein said first doped active layer is doped at a dopant dose of from about $1\times10^{11}$ ions/cm$^2$ to about $1\times10^{16}$ ions/cm$^2$.

13. The diode according to claim 1, wherein said third doped region is doped at a dopant dose of from about $1\times10^{11}$ ions/cm$^2$ to about $1\times10^{14}$ ions/cm$^2$.

14. The diode according to claim 1, wherein said first doped active layer is an n-type active layer and said second doped active layer is a p-well.

15. The diode according to claim 1, wherein said fourth doped active layer is spaced away from an edge of said first doped active layer.

16. The diode according to claim 1, wherein said fourth doped active layer is an n-type region.

17. The diode according to claim 1, wherein said fourth doped active layer is doped at a dopant dose of from about $1\times10^{12}$ ions/cm$^2$ to about $1\times10^{16}$ ions/cm$^2$.

18. The diode according to claim 1, wherein said third doped region is an n-type region.

19. The diode according to claim 1, wherein said diode is used in a CCD imager array.

20. The diode according to claim 1, wherein said diode is used in a CMOS imager array.

21. The diode according to claim 1, wherein said diode is used in a memory array.

22. The diode according to claim 1, wherein said diode is used in a logic device.

23. The diode according to claim 1, wherein said diode is a photodiode.

24. A diode for use in an imaging device, said diode comprising:
   an isolation region formed in a substrate;
   a first doped active layer of a first conductivity type formed in said substrate, said substrate being of a second conductivity type, wherein said first doped active layer is spaced apart from said isolation region;
   a second doped active layer of said first conductivity type formed within said first doped active layer, wherein said second doped active layer is doped to a higher dopant dose than said first doped active layer, wherein said first doped active layer and said substrate form a p-n junction; and
   a third doped region proximate to a lower boundary of said isolation region.

25. The diode according to claim 24, wherein the first conductivity type is n-type, and the second conductivity type is p-type.

26. The diode according to claim 24, wherein said isolation region is a field oxide region formed by the Local Oxidation of Silicon.

27. The diode according to claim 24, wherein said isolation region is a field oxide region formed by the Shallow Trench Isolation process.

28. The diode according to claim 24, wherein said first doped active layer is spaced from said isolation region by from about 0.05 µm to about 1.0 µm.

29. The diode according to claim 24, wherein said first doped active layer is spaced from said isolation region by about 0.1 µm to about 0.8 µm.

30. The diode according to claim 24, wherein said first doped active layer is spaced from said isolation region by about 0.2 µm to about 0.7 µm.

31. The diode according to claim 24, further comprising a first doped region of a second conductivity type under said isolation region.

32. The diode according to claim 31, wherein said first doped region is spaced away from the edge of said isolation region.

33. The diode according to claim 31, wherein said first doped region is a p-type region.

34. The diode according to claim 31, wherein said first doped region is doped at a dopant dose of from about $1\times10^{11}$ ions/cm$^2$ to about $1\times10^{14}$ ions/cm$^2$.

35. The diode according to claim 24, wherein said first doped active layer is doped with dopants selected from the group consisting of arsenic, antimony and phosphorous.

36. The diode according to claim 35, wherein said first doped active layer is doped with phosphorous.

37. The diode according to claim 24, wherein said second doped active layer is doped with dopants selected from the group consisting of arsenic, antimony and phosphorous.

38. The diode according to claim 37, wherein said second doped active layer is doped with phosphorous.

39. The diode according to claim 24, wherein said first doped active layer is doped at a dopant dose of from about $1\times10^{11}$ ions/cm$^2$ to about $1\times10^{16}$ ions/cm$^2$.

40. The diode according to claim 24, wherein said second doped active layer is doped at a dopant dose of from about $1\times10^{11}$ ions/cm$^2$ to about $1\times10^{16}$ ions/cm$^2$.

41. The diode according to claim 24, wherein said first doped active layer is an n− region and said second doped active layer is an n+ region.

42. The diode according to claim 24, wherein said diode is used in a CCD imager array.

43. The diode according to claim 24, wherein said diode is used in a CMOS imager array.

44. The diode according to claim 24, wherein said diode is used in a memory array.

45. The diode according to claim 24, wherein said diode is used in a logic device.

46. The diode according to claim 24, wherein said diode is a photodiode.

47. An imager device comprising:
(i) a processor; and
(ii) an imaging device coupled to said processor, said imaging device comprising:
a photodiode for use in said imaging device, said photodiode comprising:
an isolation region formed in a substrate;
a first doped photoactive layer of a first conductivity type formed in said substrate, wherein said first doped photoactive layer is spaced apart from said isolation region;
a second doped photoactive layer of a second conductivity type disposed in contact with said first doped photoactive layer, the contact of said first and second doped photoactive layers forming a p-n junction,
a third doped region formed in said second doped photoactive layer beneath said isolation region; and
a fourth doped active layer at least partially within said first doped active layer.

48. The imager according to claim 47, wherein the first conductivity type is n-type, and the second conductivity type is p-type.

49. The imager according to claim 47, wherein said isolation region is a field oxide region.

50. The imager according to claim 47, wherein said isolation region is a Shallow Trench Isolation region.

51. The imager according to claim 47, wherein said isolation region is formed of Local Oxidation of Silicon.

52. The imager according to claim 47, wherein said first doped photoactive layer is spaced from said isolation region by from about 0.05 µm to about 1.2 µm.

53. The imager according to claim 52, wherein said first doped photoactive layer is spaced from said isolation region by about 0.1 µm to about 0.8 µm.

54. The imager according to claim 47, wherein said first doped photoactive layer is spaced from said isolation region by about 0.2 µm to about 0.7 µm.

55. The diode according to claim 54, wherein said third doped region is spaced away from the edge of said isolation region.

56. The imager according to claim 47, wherein said doped region is a p-type region.

57. The imager according to claim 47, wherein said first doped photoactive layer is doped with dopants selected from the group consisting of arsenic, antimony and phosphorous.

58. The imager according to claim 57, wherein said first doped photoactive layer is doped with phosphorous.

59. The imager according to claim 57, wherein said first doped photoactive layer is doped at a dopant dose of from about $1\times10^{11}$ ions/cm$^2$ to about $1\times10^{16}$ ions/cm$^2$.

60. The imager according to claim 47, wherein said third doped region is doped at a dopant dose of from about $1\times10^{11}$ ions/cm$^2$ to about $1\times10^{14}$ ions/cm$^2$.

61. The imager according to claim 47, wherein said imager is a CCD imager.

62. The imager according to claim 47, wherein said imager is a CMOS imager array.

63. An imager device comprising:
(i) a processor; and
(ii) an imaging device coupled to said processor, said imaging device comprising:
a photodiode for use in an imaging device, said photodiode comprising:
an isolation region formed in a substrate;
a first doped photoactive layer of a first conductivity type formed in said substrate, said substrate being doped to a second conductivity type, wherein said first doped photoactive layer is spaced apart from said isolation region;
a second doped photoactive layer of said first conductivity type formed within said first doped photoactive layer, wherein said second doped photoactive layer is doped to a higher dopant dose than said first doped photoactive layer, wherein said first doped photoactive layer and said substrate form a p-n junction; and
a third doped region formed in said substrate beneath said isolation region and spaced apart from said first doped photoactive layer.

64. The imager according to claim 63, wherein the first conductivity type is n-type, and the second conductivity type is p-type.

65. The imager according to claim 63, wherein said isolation region is a field oxide region.

66. The imager according to claim 63 wherein said isolation region is a Shallow Trench Isolation region.

67. The imager according to claim 63 wherein said isolation region is formed of Local Oxidation of Silicon.

68. The imager according to claim 63 wherein said first doped photoactive layer is spaced from said isolation region by from about 0.05 $\mu$m to about 1.2 $\mu$m.

69. The imager according to claim 63 wherein said first doped photoactive layer is spaced from said isolation region by about 0.1 $\mu$m to about 0.8 $\mu$m.

70. The imager according to claim 63 wherein said first doped photoactive layer is spaced from said isolation region by about 0.2 $\mu$m to about 0.7 $\mu$m.

71. The imager according to claim 63, further comprising fourth doped region of a second conductivity type within said substrate.

72. The imager according to claim 71, wherein said fourth doped region is a p-type region.

73. The imager according to claim 72, wherein said fourth doped region is doped at a dopant dose of from about $1\times10^{11}$ ions/cm$^2$ to about $1\times10^{14}$ ions/cm$^2$.

74. The imager according to claim 63, wherein said first doped photoactive layer is doped with dopants selected from the group consisting of arsenic, antimony and phosphorous.

75. The imager according to claim 74, wherein said first doped photoactive layer is doped with phosphorous.

76. The imager according to claim 63, wherein said second doped photoactive layer is doped with dopants selected from the group consisting of arsenic, antimony and phosphorous.

77. The imager according to claim 76, wherein said second doped photoactive layer is doped with phosphorous.

78. The imager according to claim 76, wherein said first doped photoactive layer is doped at a dopant dose of from about $1\times10^{11}$ ions/cm$^2$ to about $1\times10^{16}$ ions/cm$^2$.

79. The imager according to claim 78, wherein said second doped photoactive layer is doped at a dopant dose of from about $1\times10^{12}$ ions/cm$^2$ to about $1\times10^{16}$ ions/cm$^2$.

80. The imager according to claim 63, wherein said first doped photoactive layer is an n– region and said second doped photoactive layer is an n+ region.

81. The imager according to claim 63, wherein said imager is a CCD imager.

82. The imager according to claim 63, wherein said imager is a CMOS imager.

83. A diode, said diode comprising:
an isolation region formed in a substrate;
a first doped active layer of a first conductivity type formed in said substrate, wherein said first doped active layer is spaced apart from said isolation region;
a second doped active layer of a second conductivity type in contact with said first doped active layer, the contact of said first and second doped active layers forming a p-n junction; and
a third doped region of said second conductivity type formed in said second doped active layer beneath said isolation region, wherein said third doped region is spaced away from an edge of said isolation region at a surface of said substrate; and
a fourth doped active layer of said first conductivity type at least partially within said first doped active layer and having edges spaced away from edges of said first doped active layer.

84. The diode according to claim 83, wherein said first doped active layer is doped with dopants selected from the group consisting of arsenic, antimony and phosphorous.

85. The diode according to claim 84, wherein said first doped active layer is doped with phosphorous at a dopant dose of from about $1\times10^{11}$ ions/cm$^2$ to about $1\times10^{16}$ ions/cm$^2$.

86. The diode according to claim 83, wherein said third doped region is doped at a dopant dose of from about $1\times10^{11}$ ions/cm$^2$ to about $1\times10^{14}$ ions/cm$^2$.

87. The diode according to claim 83, wherein said fourth doped active layer is doped at a dopant dose of from about $1\times10^{12}$ ions/cm$^2$ to about $1\times10^{16}$ ions/cm$^2$.

88. The diode according to claim 83, wherein said diode is used in a memory device.

89. The diode according to claim 83, wherein said diode is used in a logic device.

90. A diode, said diode comprising:
an isolation region formed in a substrate;
a first doped active layer of a first conductivity type formed in said substrate, wherein said first doped active layer is spaced apart from said isolation region;
a second doped active layer of a second conductivity type in contact with said first doped active layer, the contact of said first and second active layers forming a p-n junction; and
a third doped active layer at least partially within said first doped active layer.

91. The diode according to claim 90, wherein said first doped active layer is spaced from said isolation region by from about 0.05 $\mu$m to about 1.0 $\mu$m.

92. The diode according to claim 90, wherein said first doped active layer is spaced from said isolation region by about 0.1 $\mu$m to about 0.8 $\mu$m.

93. The diode according to claim 92, wherein said first doped active layer is spaced from said isolation region by about 0.2 $\mu$m to 0.7 $\mu$m.

94. The diode according to claim 90, further comprising a doped region below said isolation region.

95. The diode according to claim 90, wherein said doped region is spaced away from an edge of said isolation region at a surface of said substrate.

96. The diode according to claim 90, wherein said first doped active layer is doped at a dopant dose of from about $1\times10^{11}$ ions/cm$^2$ to about $1\times10^{16}$ ions/cm$^2$.

97. The diode according to claim 90, wherein said third doped active layer is doped at a dopant dose of from about $1\times10^{12}$ ions/cm$^2$ to about $1\times10^{16}$ ions/cm$^2$.

98. The diode according to claim 90, wherein said diode is a photodiode.

99. A diode, said diode comprising:
an isolation region formed in a substrate;
a first doped n-type active layer formed in said substrate, wherein said first doped n-type active layer is spaced apart from said isolation region;
a second doped n-type active layer at least partially within said first doped n-type active layer;
a first doped p-type active layer in contact with said first doped n-type active layer;
a second doped p-type region formed in said first doped p-type active layer beneath said isolation region.

100. The diode according to claim 99, wherein said first doped n-type active layer is spaced from said isolation region by from about 0.05 $\mu$m to about 1.0 $\mu$m.

101. The diode according to claim 100, wherein said first doped n-type active layer is spaced from said isolation region by about 0.1 $\mu$m to about 0.8 $\mu$m.

102. The diode according to claim 100, wherein said first doped n-type active layer is spaced from said isolation region by about 0.2 $\mu$m to 0.7 $\mu$m.

103. The diode according to claim 99, wherein said second doped p-type region is spaced away from an edge of said isolation region at a surface of said substrate.

104. The diode according to claim 99, wherein said first doped n-type active layer is doped at a dopant dose of from about $1\times10^{11}$ ions/cm$^2$ to about $1\times10^{16}$ ions/on$^2$.

105. The diode according to claim 99, wherein said second doped p-type region is doped at a dopant dose of from about $1\times10^{11}$ ions/cm$^2$ to about $1\times10^{14}$ ions/cm$^2$.

106. The diode according to claim 99, wherein said second doped n-type active layer is spaced away from an edge of said first doped n-type active layer.

107. The diode according to claim 99, wherein said second doped n-type active layer is doped at a dopant dose of from about $1\times10^{12}$ ions/cm$^2$ to about $1\times10^{16}$ ions/cm$^2$.

108. The diode according to claim 99, wherein said diode is a photodiode.

* * * * *

UNITED STATES PATENT AND TRADEMARK OFFICE
CERTIFICATE OF CORRECTION

PATENT NO.      : 6,838,714 B2
DATED           : January 4, 2005
INVENTOR(S)     : Howard E. Rhodes et al.

It is certified that error appears in the above-identified patent and that said Letters Patent is hereby corrected as shown below:

Column 4,
Line 44, "Understood" should be -- understood --.

Column 11,
Line 15, "comprising" should be -- comprising a --.

Signed and Sealed this

Nineteenth Day of July, 2005

JON W. DUDAS
*Director of the United States Patent and Trademark Office*